United States Patent
Kwon et al.

(10) Patent No.: US 7,090,742 B2
(45) Date of Patent: Aug. 15, 2006

(54) DEVICE FOR PRODUCING INDUCTIVELY COUPLED PLASMA AND METHOD THEREOF

(75) Inventors: Kwang-Ho Kwon, 125-1402, Hanbit APT., Eoeun-dong, Yuseong-gu, Daejeon-city (KR) 305-755; Jae-Ki Sim, Daejeon (KR)

(73) Assignee: Kwang-Ho Kwon, Daejon (KR)

( * ) Notice: Subject to any disclaimer, the term of this patent is extended or adjusted under 35 U.S.C. 154(b) by 187 days.

(21) Appl. No.: 10/503,015

(22) PCT Filed: Feb. 7, 2003

(86) PCT No.: PCT/KR03/00270

§ 371 (c)(1),
(2), (4) Date: Jul. 28, 2004

(87) PCT Pub. No.: WO03/067642

PCT Pub. Date: Aug. 14, 2003

(65) Prior Publication Data

US 2005/0130450 A1 Jun. 16, 2005

(30) Foreign Application Priority Data

Feb. 8, 2002 (KR) .................. 10-2002-0007407

(51) Int. Cl.
*C23F 1/02* (2006.01)
*H01J 7/24* (2006.01)

(52) U.S. Cl. .................. 156/345.48; 156/345.49; 315/111.71; 315/111.41

(58) Field of Classification Search .............. None
See application file for complete search history.

(56) References Cited

U.S. PATENT DOCUMENTS

| | | | | | |
|---|---|---|---|---|---|
| 5,680,014 | A | * | 10/1997 | Miyamoto et al. | 315/111.41 |
| 5,897,923 | A | * | 4/1999 | Tamura et al. | 427/571 |
| 6,071,372 | A | * | 6/2000 | Ye et al. | 156/345.48 |
| 2002/0170678 | A1 | * | 11/2002 | Hayashi et al. | 156/345.48 |

FOREIGN PATENT DOCUMENTS

| | | |
|---|---|---|
| JP | 6-226032 | 8/1994 |
| JP | 11-191553 | 7/1999 |
| JP | 11-251088 | 9/1999 |
| JP | 2000-208298 | 7/2000 |

OTHER PUBLICATIONS

Lieberman et al. *Principles of Plasma Discharges and Materials Processing*. John Wiley & Sons, Inc, New York, pp. 433, 1994.

* cited by examiner

*Primary Examiner*—Tuyet Thi Vo
(74) *Attorney, Agent, or Firm*—Hamre, Schumann, Mueller & Larson, P.C.

(57) ABSTRACT

A device for producing inductively coupled plasma and method thereof, wherein a coil is uniformly and dispersedly arranged on a lateral wall in a chamber, instead of the prior device of a permanent magnet mounted on an external wall of the chamber, and the coil is so disposed as to allow a magnetic field formed from the coil to be mutually reinforced at a central portion of the coil, such that charged particles created inside the chamber are effectively isolated relative to the lateral wall of the chamber, thereby enabling to produce plasmas of high density and high uniformity. Intensity and frequency of power source applied to the coil are adjusted to enable to adjust the density and uniformity of plasmas produced in the chamber according to required process characteristics in etching or depositing process using plasmas such that flexibility is provided to the process using the plasmas and design of new process can be free from restriction calling for process chamber configure. The present invention is simplified in structure thereof because of a permanent magnet being dispensed with, to thereby reduce the manufacturing cost greatly.

5 Claims, 5 Drawing Sheets

(a)

DIRECTION OF CURRENT FLOW → (b) ← DIRECTION OF CURRENT FLOW (c)

(d)

DEVICE FOR PRODUCING INDUCTIVELY COUPLED PLASMA AND METHOD THEREOF

This application is the national phase under 35 U.S.C. 371 of PCT International Application No. PCT/KR03/00270 which has an International filing date of Feb. 7, 2003, which designated the United States of America and which claims priority on Republic of Korea Patent Application number 10-2002-0007407 filed Feb. 8, 2002, the entire contents of which are hereby incorporated herein by reference.

FIELD OF THE INVENTION

The present invention relates to a device for producing inductively coupled plasma (I CP) used in dry etching or thin-film deposition device and, more particularly, to a device and a method for producing ICP adapted to form a coil at a lateral wall of a chamber in order to reinforce a magnetic field at the lateral wall of the chamber, thereby increasing plasma density in the chamber and improving uniformity of the plasma density.

Etching processes among semiconductor manufacturing procedures are designed to selectively remove thin films through the photoresist patterns and are classified into a dry etching method and a wet etching method. There is a disadvantage in the wet etching method in that wafers contained in a boat are dipped in a tank filled with etching solution and the thin film of the open area is chemically reacted with the etching solution and removed. Accordingly, a laterally etched profile is obtained.

In contrast, the dry etching method has been developed to form fine patterns and etching gas is used instead of etching solution. One of the dry etching methods widely employed in manufacturing semiconductors is plasma etching technology utilizing plasma.

Plasmas, which are composed of positive ions, negative ions and neutral particles, are quite different from gases of normal conditions in terms of electric and thermal properties such that the plasmas are called the fourth state of material. In other words, the plasmas contain ionized gases, and when magnetic fields or electric fields are applied, plasma particles are the plasmas, thereby giving rise to chemical or physical reactions on the surface of the solid.

Plasma is classified into two types: One is a low temperature glow discharge plasma of around tens thousand degrees Celsius with a density of $10^9$ to $10^{10}$/cubic centimeters; and the other is a super temperature nuclear fusion plasma of over ten million degrees Celsius with a density of $10^{13}$ to $10^{14}$/cubic centimeters. Plasma used for semiconductor etching or evaporation is a low temperature glow discharge plasma of a low ionization degree containing approximately 90% of neutral gases.

Today, the dry etching method is gradually being adopted, which uses plasma device for generating a high density plasma in the semiconductor process because the demand for fine processing is rigorous as the integration level increases for the semiconductor device. In other words, in order to get fine pattern of sub-micron level, a mean free path within the plasma should be lengthened in order to obtain anisotropy of etched sectional surface, for which a high density of plasma is required.

Furthermore, as large-sized wafers of each exceeding 8 inches in diameter are increasingly used, the demand for uniformity in the plasma density also increases. Particularly, in manufacturing processes of various types of flat displays such as TFT-LCD, PDP, FED and the like, large-sized substrates are used as test samples such that it is very important that high density of plasmas should be uniformly maintained not only at the center but also at the edge of the chamber.

The high density plasma includes Electron Cyclotron Resonance (ECR) plasma using resonance phenomenon, helicon plasma using helicon or whistler wave and Inductively Coupled Plasma (ICP) using high temperature and low pressure. There is an advantage in the ECR plasma in that it can create high density plasmas under low pressure but there is a disadvantage in that it is difficult to form a uniform distribution of plasmas. There is an advantage in the helicon plasma in that energies of electric field and magnetic field are complexly excited, such that high density of plasmas having a uniform distribution can be created in a small scale but it is disadvantageous in that uniform distribution can hardly be expected in a large area. Meanwhile, the ICP utilizes a magnetic field formed about a coil to increase a collision probability of electrons, thereby obtaining a high density of plasmas.

The Structure and operational principle of the conventional ICP will be described with reference to FIG. 1 or 2.

A plasma generating device is formed with a chamber 108 for containing plasmas, and the chamber 108 is isolated from the atmosphere by a chamber wall to maintain a vacuum state. The chamber 108 includes a gas inlet 106 for supplying reaction gas, a vacuum pump 112 for maintaining a vacuum state inside the chamber and for discharging the reaction gas when the reaction is completed, and a gas outlet 114.

Furthermore, the chamber 108 includes a chuck 116 for mounting a testing sample 110 such as a wafer or a glass substrate, and an antenna 102 connected with a high frequency power source 100 at an upper side (FIG. 1) or at a lateral surface thereof (FIG. 2). Between the antenna 102 and the chamber 108 there is installed a quartz plate 104 to block a capacitive coupling between the antenna 102 and the plasmas so that the energy from the high frequency power source 100 can be transmitted to the plasmas only through the inductive coupling.

In the plasma generating device thus described, the vacuum pump 112 is initially used to evacuate air from the chamber 108, and reaction gas for generating the plasmas is supplied from the gas inlet 106 and ten the antenna 102 is applied with the high frequency power source 100. When the power is applied, a magnetic field which varies in time perpendicularly to a plane formed by the antenna 102 is produced and the varying magnetic field generates an inductive electric field inside the chamber 108. The inductive electric field serves to accelerate the gas particles inside the chamber 108 end the accelerated gas particles collide thereamong to generate ions and radicals. The generated ions and radicals in plasma states are used for etching and evaporation of the test pieces.

However, there is drawback in that the ions and radicals in plasma states generated inside the chamber collide with the lateral walls of the reaction chamber and vanish such that it is impossible to obtain a high density and high uniformity of plasmas exceeding a predetermined quantity.

Conventionally, in order to overcome the aforementioned problem, a permanent magnet 200 is installed at an outer wall of the reaction chamber 108, so that the ions or electrons inside the camber are prevented from colliding with the lateral walls of the reaction chamber by the magnetic field formed by the permanent magnet 200, thereby to obtain the high density of plasmas, as is shown in FIG. 3.

The ions or electrons formed in the chamber by the above-mentioned method can stay in the plasmas, and as a result, the ions and the electrons collide more frequently in the plasmas to increase the density of the plasmas.

However, there are disadvantages in the structure thus described in that a permanent magnet is additionally mounted to complicate the entire structure, and the permanent magnet cannot be easily replaced when there is a need to adjust the density and uniformity of the plasmas in relation to the characteristics of the process, thereby incurring lots of restrictions in trying other processes or in developing new processes.

SUMMARY OF THE INVENTION

The embodiment of the present invention is disclosed to solve the aforementioned problems and it is an object of the present invention to provide a device for producing plasma, such as capacitively coupled plasma and inductively coupled plasma configured in a simple structure without a permanent magnet installed at a lateral wall of a chamber to prevent charged particles in the plasmas from colliding with the lateral wall in the chamber and to generate a high density of plasmas.

It is another object of the present invention to provide a device for producing plasma, such as capacitively coupled plasma and inductively coupled plasma configured with a coil installed uniformly distributed on the lateral wall of a chamber to allow the density of the plasmas to be uniformly maintained regardless of the position in the inside of the chamber.

It is still another object of the present invention to provide a device for producing plasma, such as capacitively coupled plasma and inductively coupled plasma configured with an inductively coupled coil uniformly arranged on the lateral wall of a chamber to allow power applied to the inductively coupled coil to be adjusted, thereby enabling to improve the flexibility of the etching or deposition process.

It is still a further object of the present invention to provide a device for producing plasma, such as capacitively coupled plasma and inductively coupled plasma configured to connect an antenna positioned at an upper side of a chamber to a coil disposed at the lateral wall of the chamber to allow same to be driven by a single power source, thereby simplifying the structure and producing a higher density of plasmas.

It is still a further object of the present invention to provide a method for producing plasma, such as capacitively coupled plasma and inductively coupled plasma of a high density and high uniformity of plasmas.

It is still a further object of the present invention to provide a method for producing plasma, such as capacitively coupled plasma and inductively coupled plasma configured to adjust the density or uniformity of plasmas in a chamber, thereby enabling to provide flexibility to the etching and deposition processes using plasmas.

In accordance with the objects of the present invention, there is provided a device for producing inductively coupled plasma, the device comprising: a high frequency power source; an antenna receiving a high frequency power from the high frequency power source; a chamber for containing plasmas generated by an electromagnetic field produced by the antenna; a coil uniformly and dispersedly arranged along the lateral wall of the chamber; and a coil power source providing power to the coil, wherein the coil produces electromagnetic field for isolating the plasmas from the lateral wall of the chamber.

According to the present invention, a coil is uniformly and dispersedly arranged on a lateral wall of a chamber to which a coil power is applied to produce an electromagnetic field, whereby charged particles within plasmas are restrained without disappearing via collision with the chamber, thereby to produce a high density of plasmas.

Particularly, there is an advantage in that the coil is uniformly and dispersedly arranged along the lateral wall of the chamber to minimize the bad effects caused by the arranged shapes of the coil influencing on the uniformity of plasmas, such that plasma density decrease and non-uniformity near the lateral wall of the chamber can be avoided, thereby making the density of plasmas more uniform.

BRIEF DESCRIPTION OF THE DRAWINGS

For fuller understanding of the nature and objects of the invention, reference should be made to the following detailed description taken in conjunction with the accompanying drawings in which.

DETAILED DESCRIPTION OF THE INVENTION

Figure 2:
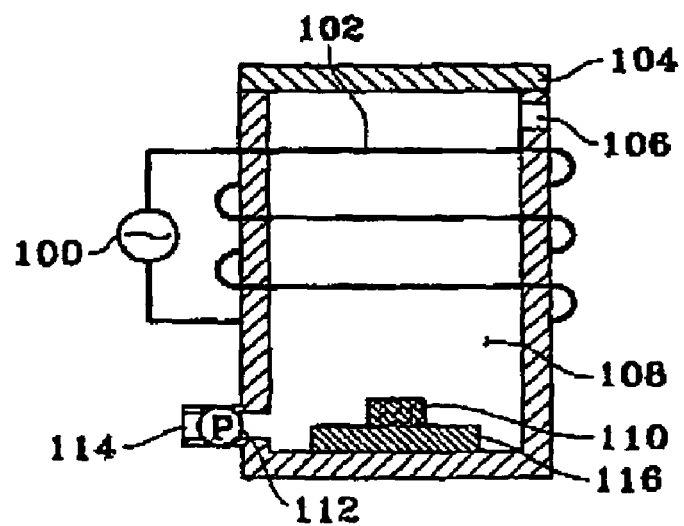
FIG. 2 is a schematic structural drawing of a device for producing inductively coupled plasma according to the prior art.
Figure 3:
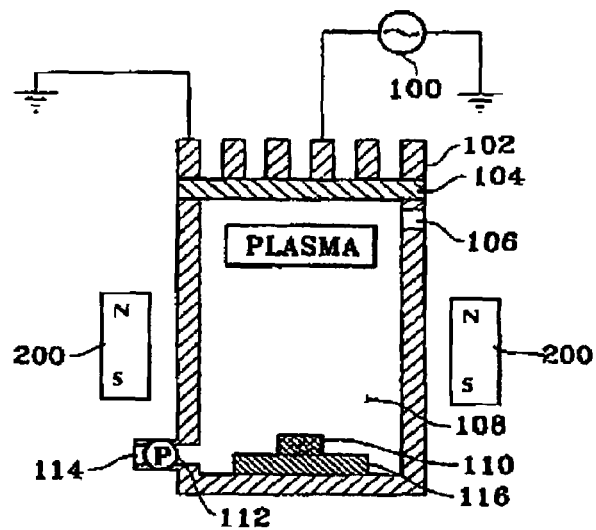
FIG. 3 is a schematic structural drawing of a device for producing inductively coupled plasma using a permanent magnet according to the prior art.

As shown in FIG. 2, plasma producing devices utilizing surface wave plasma were used in the past, which was disclosed by Smullin and Chorney (1958) and Trivelpiece and Gould (1959). Moisan and Zakrzewski (1991) used the device to generate plasmas at antenna frequency of 1 MHz–10 GHz. These inventors used a coil, a shape similar to the lateral coil of the present invention, to produce the plasmas. However, the plasma producing devices thus described were not used for semiconductor processing because these devices were not regarded as being appropriate thereto.

The reason was that, when a plasma producing device is used to produce the plasmas by way of surface wave plasma, the L/R ratio [Ratio of R (chamber radius) and L (perpendicular length of lateral wall)] should be large enough in order for energy to be properly absorbed into plasmas (Refer to Chapter 13 of Libermann, Principles of plasma discharges and materials and processing) and thus, a chamber should be long to make the plasma producing device bulky.

In comparison thereto, a large L/R ratio is not necessary in the present invention, thereby eliminating the aforementioned problems because it is not the main object of the present invention to apply power to the lateral coil and to produce plasmas in a chamber. The main object of the present invention is to form a magnetic field at the lateral wall by way of the lateral coil, and, using the magnetic field, to prevent plasma states of electrons and ions formed inside the chamber from colliding with the lateral wall of the chamber and becoming extinct, thereby improving density and uniformity of plasmas.

Furthermore, when direct current DC or AC with low frequency is used as a power source to the coil, no problems occur caused by reflective power because reactance (ωL) generated from the lateral coil is small and there occurs no coupling problem with the power applied to an upper coil in the chamber either.

In other words, in the present invention, plasmas are generated by an upper antenna in the chamber applied with high frequency power whereas uniformity of plasmas generated in the chamber are adjusted by the lateral coil in the chamber. Particularly, as wafers become large in size, the uniformity of plasmas gains more weight and importance such that the present invention can bring a very useful result in this regard.

Meanwhile, the intensity of the magnetic field is decreased in inverse proportion to the distance from a conductor, that is, the coil, such that the approach of charged particles is greatly restricted at a lateral wall of the chamber near the coil. However, the charged particles relatively and easily collide with the lateral wall in the chamber where the coil is not positioned to become extinct. As a result, the density of plasmas is not uniformly formed in relation to positions thereof. In order to prevent the afore-said problems, the coil is wound in a rectangular, a round, a triangular or a sine wave style to reinforce the weakened intensity of magnetic field around the coil such that the uniform density of plasmas can be formed regardless of positions.

Figure 1:
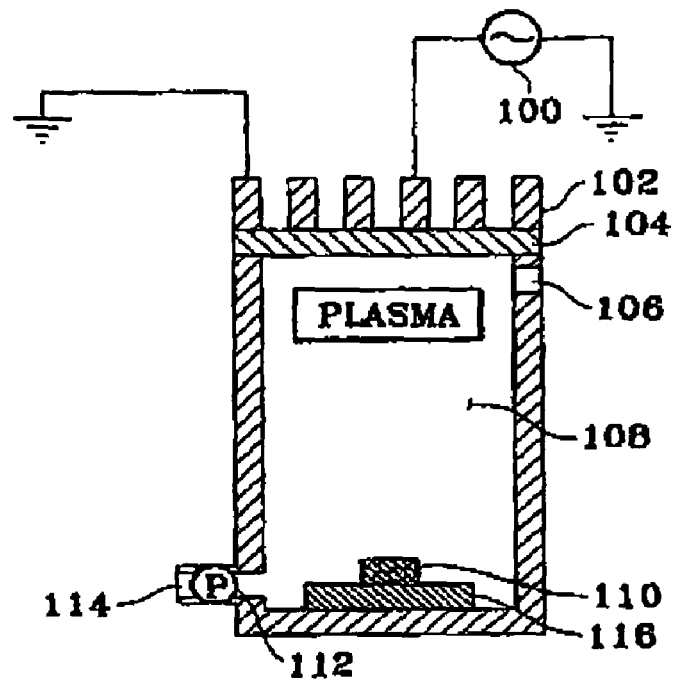
FIG. 1 is a schematic structural drawing of a device for producing inductively coupled plasma according to the prior art.
Figure 4:
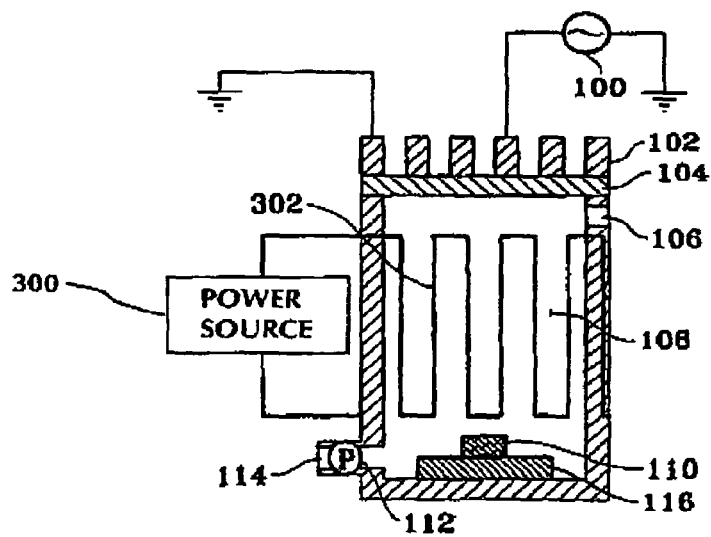
FIG. 4 is a schematic structural drawing of a device for producing inductively coupled plasma according to an embodiment of the present invention.
Figure 5:
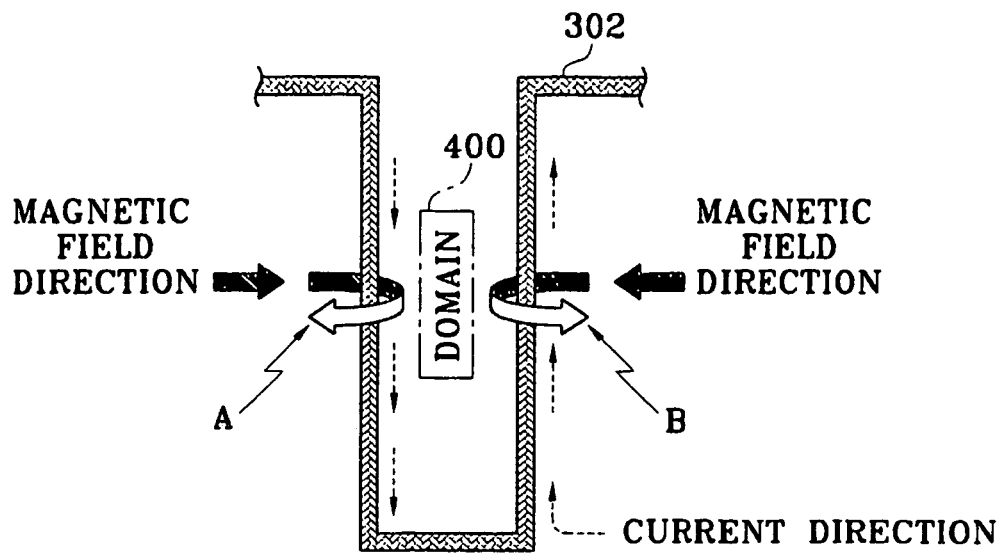
FIG. 5 is a schematic drawing for illustrating a direction where magnetic field is formed around a coil shown in FIG. 4.

Thereafter, the construction and operation of the present invention will be described in detail with reference to FIGS. 4 and 5. The construction of FIG. 4 is the same as that of FIG. 1 except for a power source 300 and a coil 302 so that an explanation on the identical structure will be omitted and only the power source 300 and the coil 302 will be described.

Plasmas generated by the high frequency power source 100 and the antenna 102 within the chamber 108 collides with the lateral wall in the chamber 108 via diffusion. However, when power is applied to the coil 302, a magnetic field is formed as shown in FIG. 5 and charged particles within the plasmas having positive and negative electric propensities are influenced by the magnetic field to be isolated from the lateral wall of the chamber 108. Particularly, when a current flows at a domain 400 where the coil 302 is not positioned in response to the applied power to a direction indicated in FIG. 5, the magnetic field is not weakened in intensity thereof even if distanced from the coil 302 because the magnetic field in the domain 400 is increased by adding magnetic fields created by a conductor (A) and another conductor (B), which are parts of the coil 302. The plasmas within the chamber can maintain a high density and high uniformity because of the reason thus mentioned.

Furthermore, intensity and frequency of power applied to the coil can be adjusted in the present invention, such that density and uniformity of the plasmas can be adjusted in relation to etching or deposition process characteristics using the plasmas. Owing to adjustability of density and uniformity of plasmas, there is an advantage in the present invention in that designing of a new process can be easily achieved without consideration of process chamber configuration. Particularly, this advantage can be peculiar effect that cannot be embodied by the conventional arts using permanent magnets.

Figure 6:
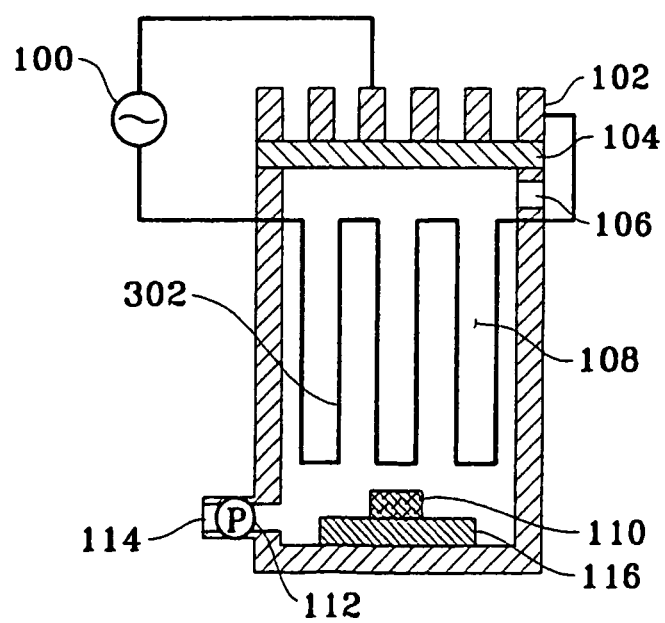
FIG. 6 is a schematic drawing for illustrating c device for producing inductively coupled plasma according to an embodiment of the present invention.

Meanwhile, the device for producing inductively coupled plasma according to the present invention can be further simplified in construction thereof by driving the coil 302 and the antenna 102 by way of the same power source 100 as illustrated in FIG. 6.

However, in this case, the power source 100 applied to the antenna 102 should be composed of a high frequency power source. This is because the antenna 102 cannot be connected to DC power. Therefore, the same high frequency power source should be applied to the antenna 102. In other words, in case the antenna 102 and the coil 302 are driven by separate power sources, power source applied to the coil 302 can be either AC or DC, but when the coil 302 is driven by the same power source, the coil 302 should be applied only with AC power source.

Figure 7:
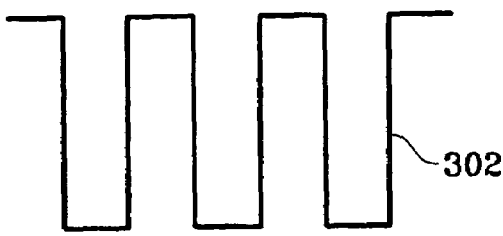
FIG. 7 is a diagram for illustrating a form of a coil according to an embodiment of the present invention.
Figure 7:
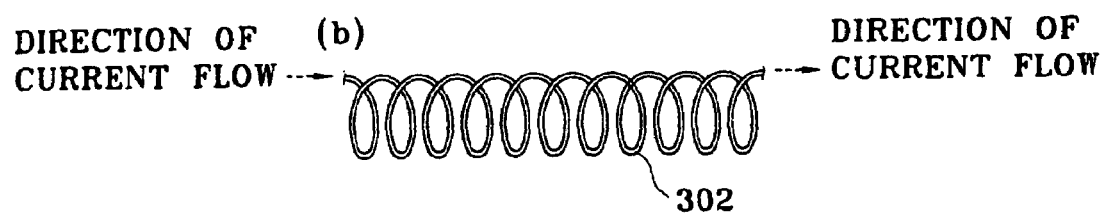
Figure 7:
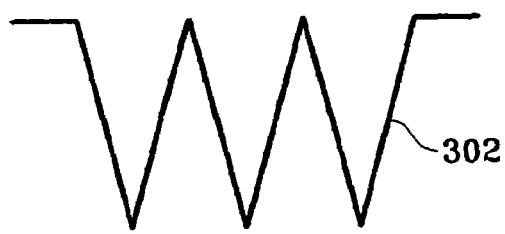
Figure 7:
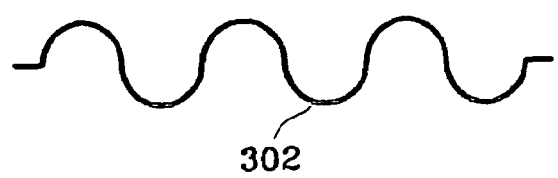
Figure 8:
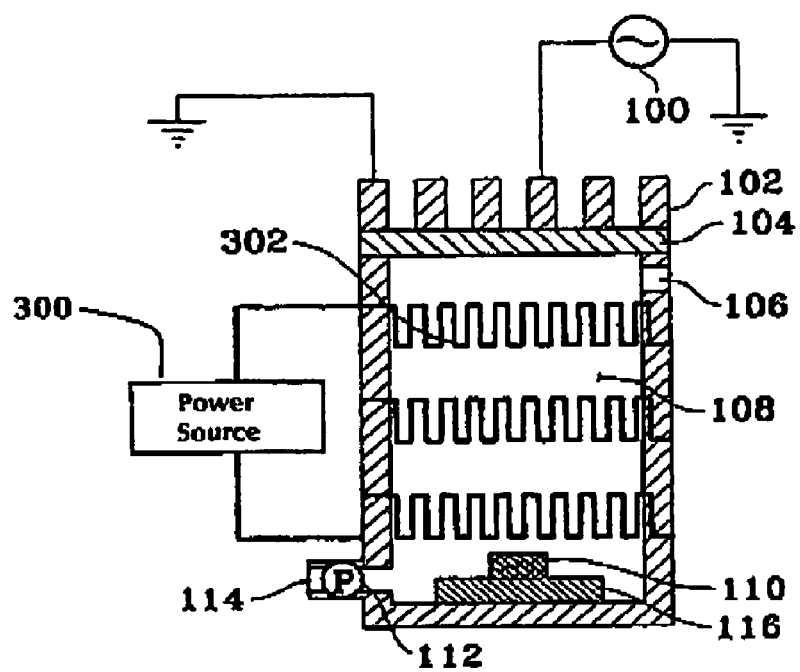
FIG. 8 is a schematic drawing for illustrating a device for producing inductively coupled plasma, the device wound with coil a plurality of times, according to an embodiment of the present invention.

As illustrated in FIG. 7, a coil is formed in various shapes such as rectangular, round, triangular or sine wave shapes. These shapes of coil can bring about the same effect as the magnetic reinforcement effect in the domain 400 shown in FIG. 5, and the size and number of windings of coil can be determined by the process condition, size of the chamber and the like. FIG. 8 illustrates a coil wound several times according to process condition or size of the chamber.

While the present invention has been described in terms of preferred embodiments, this invention may be embodied in several other forms without departing from the spirit of essential characteristics thereof and the present embodiments are therefore illustrative and not restrictive, since those skilled in the art will recognize with considerable modification within the spirit and scope of the appended claims.

The present invention is so disposed with a coil as to allow the magnetic fields thereof to be mutually reinforced in the domain 400, instead of using a permanent magnet as in the prior arts. As a result, a permanent magnet used in the conventional device for producing inductively coupled plasma is dispensed with, and the density and uniformity of plasmas can be improved by a coil.

Furthermore, magnetic fields formed around a coil can be varied by a change in intensity and frequency of the power source 300 applied to the coil such that changes of plasmas resulting from the changes of process conditions due to etching or depositing equipment can be easily coped with, and the flexibility of etching or depositing process can be improved.

It should be also noted that a coil disposed at an upper side and a coil equipped at a lateral wall of the chamber in the conventional device for producing inductively coupled plasma can be connected to be combined and made as one coil, thereby simplifying the structure of the plasma producing device.

What is claimed is:

1. A device for producing plasma, the device comprising: a high frequency power source; plasma generating means receiving a high frequency power from said high frequency power source for generating plasmas; a chamber for containing plasmas generated by said plasma generating means; a coil uniformly wound along a lateral wall of said chamber; and an AC power source of low frequency or DC power source providing power to said coil, wherein said coil is wound along said lateral wall inside of said chamber in a rectangular, round, triangular or sine wave shape, and wherein said coil produces a magnetic field for isolating said plasma from said lateral wall of said chamber and preventing said plasmas generated in said chamber from being reacted with said lateral wall of said chamber.

2. The device as claim in claim 1, wherein said coil is wound on said lateral wall of said chamber at least more than one time.

3. A device for produting plasma, the device comprising: a high frequency power source; plasma generating means receiving a high frequency power from said high frequency power source for generate plasmas; a chamber for containing plasmas generated by said plasma generating means; a coil uniformly wound along a lateral wall of said chamber; and AC power source providing power to said coil, where said coil is wound along said lateral wall inside of said chamber in a rectangular, round, triangular or sine wave shape, and wherein said coil produces a magnetic field for isolating said plasmas from said lateral wall of said chamber and preventing said plasmas generated in said chamber from being reacted with said lateral wall of said chamber, and said plasma generating means and said coil are driven by the same power source.

4. A method for producing plasma, the method comprising the steps of:

exhausting a chamber so that said chamber can be vacuum; supplying reaction gases into said chamber through a gas inlet; applying a high frequency power to plasma generating means at an upper side of said chamber to generate plasmas in said chamber; and applying AC power source of low frequency or DC power source to a coil uniformly wound along a lateral wall of said chamber to allow said plasinas to be isolated from said lateral wall of said chamber, where said coil is wound along said lateral wall inside of said chamber in a rectangular, round, triangular or sine wave shape.

5. A method for producing plasma, the method comprising the steps of:

exhausting a chamber so that said chamber can be vacuum; supplying reaction gases into said chamber through a gas inlet; applying a high frequency power to plasma generating means at an upper side of said chamber to generate plasmas in said chamber; and applying AC power source to a coil uniformly wound along a lateral wall of said chamber to allow said plasmas to be isolated from said lateral wall of said chamber, where said coil is wound along said lateral wall inside of said chamber in a rectangular, round, triangular or sine wave shape, and wherein said plasma generating means and said coil arc driven by the same power source.

* * * * *